United States Patent
Ohtsuki et al.

(10) Patent No.: US 10,886,129 B2
(45) Date of Patent: Jan. 5, 2021

(54) METHOD FOR MANUFACTURING SEMICONDUCTOR DEVICE AND METHOD FOR EVALUATING SEMICONDUCTOR DEVICE

(71) Applicant: SHIN-ETSU HANDOTAI CO., LTD., Tokyo (JP)

(72) Inventors: Tsuyoshi Ohtsuki, Annaka (JP); Tadashi Nakasugi, Takasaki (JP); Hiroshi Takeno, Annaka (JP); Katsuyoshi Suzuki, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/318,223

(22) PCT Filed: Jul. 3, 2017

(86) PCT No.: PCT/JP2017/024362
§ 371 (c)(1),
(2) Date: Jan. 16, 2019

(87) PCT Pub. No.: WO2018/020961
PCT Pub. Date: Feb. 1, 2018

(65) Prior Publication Data
US 2019/0267239 A1    Aug. 29, 2019

(30) Foreign Application Priority Data
Jul. 26, 2016  (JP) ................... 2016-145979

(51) Int. Cl.
*H01L 21/02*   (2006.01)
*H01L 21/265*  (2006.01)
(Continued)

(52) U.S. Cl.
CPC .... *H01L 21/2003* (2013.01); *H01L 21/02381* (2013.01); *H01L 21/265* (2013.01); *H01L 29/78* (2013.01); *Y02P 70/50* (2015.11)

(58) Field of Classification Search
CPC ............... H01L 29/045; H01L 29/785; H01L 21/02381; H01L 21/265; H01L 21/2003;
(Continued)

(56) References Cited

U.S. PATENT DOCUMENTS 7,547,637 B2    6/2009  Brask et al.
9,024,368 B1 *  5/2015  Yu ....................... H01L 29/7848
                                                    257/288
(Continued)

FOREIGN PATENT DOCUMENTS

JP    S60-145665 A    8/1985
JP    2002-158357 A   5/2002
(Continued)

OTHER PUBLICATIONS

Apr. 9, 2019 Office Action issued in Japanese Patent Application No. 2016-145979.
(Continued)

*Primary Examiner* — Caridad Everhart
(74) *Attorney, Agent, or Firm* — Oliff PLC (57) ABSTRACT

A method for manufacturing a semiconductor device, including forming a Fin structure on a semiconductor silicon substrate, performing ion implantation into the Fin structure, and subsequently performing recovery heat treatment on the semiconductor silicon substrate to recrystallize silicon of the Fin structure, wherein the Fin structure is processed so as not to have an end face of a {111} plane of the semiconductor silicon onto a sidewall of the Fin structure to be formed. It also includes a method for manufacturing a semiconductor device that is capable of preventing a defect from being
(Continued)

introduced into a Fin structure when the Fin structure is subjected to ion implantation and recovery heat treatment.

4 Claims, 4 Drawing Sheets

(51) Int. Cl.
*H01L 21/20* (2006.01)
*H01L 29/78* (2006.01)

(58) Field of Classification Search
CPC ........... H01L 29/2003; H01L 29/66795; H01L 21/26586; H01L 21/0262; Y02P 70/605; Y02P 70/50
See application file for complete search history.

(56) References Cited

U.S. PATENT DOCUMENTS

| | | |
|---|---|---|
| 2004/0145000 A1 | 7/2004 | An et al. |
| 2005/0184283 A1 | 8/2005 | Maeda et al. |
| 2010/0208522 A1* | 8/2010 | Hayashi ............... B82Y 10/00 365/185.18 |
| 2013/0248942 A1 | 9/2013 | Okano |
| 2014/0087547 A1* | 3/2014 | Miyano ............... H05B 6/806 438/486 |
| 2015/0024565 A1 | 1/2015 | Maeda et al. |
| 2016/0211352 A1* | 7/2016 | Chuang ............ H01L 29/66795 |

FOREIGN PATENT DOCUMENTS

| | | |
|---|---|---|
| JP | 2005-236305 A | 9/2005 |
| JP | 2006-517060 A | 7/2006 |
| JP | 2013-197342 A | 9/2013 |
| JP | 2014-063897 A | 4/2014 |
| WO | 9706564 A1 | 2/1997 |
| WO | 2016/166930 A1 | 10/2016 |

OTHER PUBLICATIONS

Sep. 19, 2017 International Search Report issued in International Patent Application No. PCT/JP2017/024362.
Sasaki et al; "Optimization of standard As ion implantation for NMOS Si bulk FinFETs extension;" Ext. Abs. the 13th International Workshop on Junction Technology; pp. 22-25; 2013.
Xiong; "FinFETs and Other Multi-Gate Transistors;" 2 Multigate MOSFET Technology; pp. 60-65; 2008.
Tamura et al; "Lattice Defects in High-Dose As Implantation into Localized Si Area;" Japanese Journal of Applied Physics; vol. 27; No. 12; pp. 2209-2217; Dec. 1988.
Matsukawa et al; "Analysis of current-onset voltage fluctuation for FinFETs: Influence of work-function variation of metal gates;" p. 13-150; 2013.
Matsukawa et al; "Suppressing FinFET variability using amorphous metal gate;" p. 13-175; 2013.
Feb. 7, 2019 International Preliminary Report on Patentability issued in International Patent Application No. PCT/JP2017/024362.

* cited by examiner

METHOD FOR MANUFACTURING SEMICONDUCTOR DEVICE AND METHOD FOR EVALUATING SEMICONDUCTOR DEVICE

TECHNICAL FIELD

The present invention relates to a method for manufacturing a semiconductor device and a method for evaluating a semiconductor device, particularly relates to a method for manufacturing a semiconductor device having a Fin structure and a method for evaluating a semiconductor device manufactured by the method for manufacturing a semiconductor device.

BACKGROUND ART

The ion implantation technology is a very important method for manufacturing semiconductor parts, including various transistors. In this method, however, an implantation element to be a dopant is ionized and accelerated, and then implanted into silicon. Accordingly, the accelerated ion causes damage to the silicon. To prevent this damage, various methods have been investigated, based on a method of heat treatment at a high temperature that is sufficient to reconstruct damaged bond of the silicon (e.g., silicon changed to amorphous) to perform single-crystallization, thereby recovering the same.

In conventional planar transistors, which is manufactured by forming an oxide film on a silicon substrate, performing a lithography step and an etching step to form a window, and performing ion implantation thereinto to form a diffusion layer, recovery of the damage, that is, recrystallization of the ion-implanted layer occurs from the both edges of the bottom and the sidewall of the buried structure.

On the other hand, in Fin structures (column structures), which are adopted in advanced articles (advanced devices), since recrystallization after ion implantation proceeds from only the bottom of the Fin structure, there can be a defect such as a twin (NON-PATENT LITERATURE 1). Fin structures have characters such that the area to be ion implanted is very small compared to that in the previous buried structures, and that the implantation is performed from a slanting direction, not only from a vertical direction to a wafer as in the previous buried structures, in order to perform the ion implantation to the Fin structure uniformly. Moreover, they are adopted in minute structures, thereby tending to have very short period of annealing for recovering damages caused by ion implantation (recovery heat treatment). As will be suggested from this, the Fin structure can have insufficient recovery of the damage and the defect after ion implantation.

Additionally, NON-PATENT LITERATURE 2 describes plane orientations of silicon and forming a Fin. NON-PATENT LITERATURE 2 focused on the plane orientation in order to optimize the mobility of electrons and holes, and summarizes concrete examples of application thereof. The plane orientation is focused only for the reason for relating to the mobility that effects to device performances, and NON-PATENT LITERATURE 2 does not relate occurrence and control of defects caused by process such as ion implantation.

CITATION LIST

Non-Patent Literature

NON-PATENT LITERATURE 1: Ext. Abs. the 13th International Workshop on Junction Technology 2013, p 22

NON-PATENT LITERATURE 2: Edited by J.-P. Colinge, "FinFETs and Other Multi-Gate Transistors", Springer (2008), p 61

NON-PATENT LITERATURE 3: M. Tamura and M. Horiuchi: "Lattice Defects in High-dose As Implantation into Localized Si Area", Jpn. J. Appl., Phys., 27, 2209-2217 (1988)

SUMMARY OF THE INVENTION

Technical Problem

The device is expected to be improved in performance when it has higher mobility of electrons and holes. NON-PATENT LITERATURE 2 refers to relation between the plane orientation and the mobility, and refers to a method for improving the performance of a device by changing the angle (direction) for forming a Fin. In view of the mobility of carriers, this mobility can be sacrificed by a method of rotating a wafer (changing the crystal orientation in a direction of extension of the Fin structure) to prevent a defect in the Fin structure, though the defect can be prevented.

Figure 6:
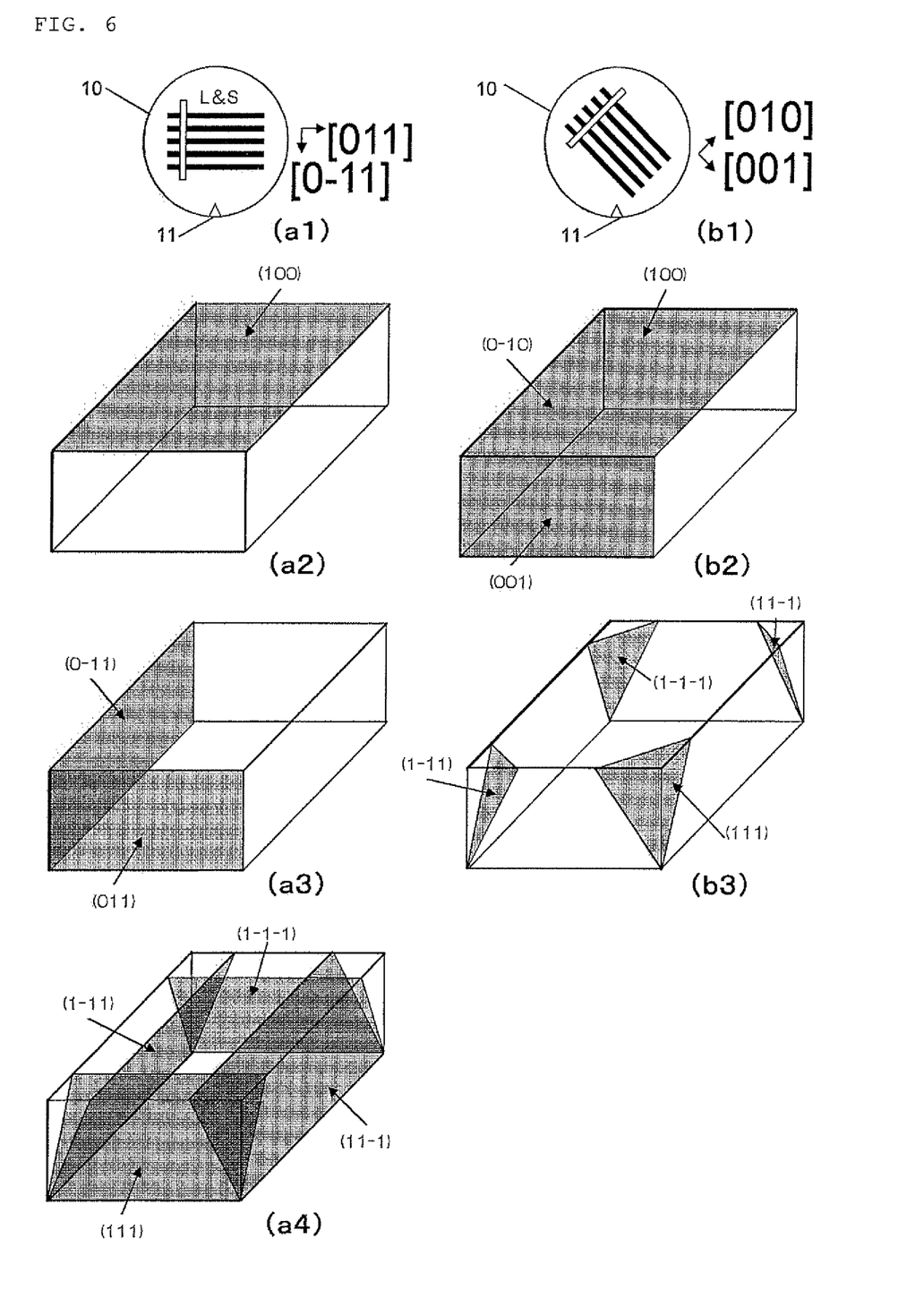
FIG. 6 is a schematic view showing a state of {111} plane in a Fin structure.

In the method of rotating a wafer, the Fin structure has {111} planes at the edges (four corners) when the wafer is rotated (the direction of extension of the Fin structure is rotated) as shown in FIG. 6. Accordingly, it is fundamentally difficult to completely eliminate defects though the existence rate can be decreased. It is considered that finer processing particularly makes an influence of the defect at the edge of Fin structure more serious. Incidentally, FIGS. 6 (a1) to (a4) indicate a case in which the direction of extension of the Fin structure is vertical to the direction of a notch 11, and FIGS. 6 (b1) to (b3) indicate a case in which the direction of extension of the Fin structure is rotated from the direction of the notch 11 by 45°. Herein, FIGS. 6 (a1) and (b1) are diagrams to show a relation between the direction of the notch 11 and the direction of extension of the Fin structure (it is referred to as L&S in the figures); and FIGS. 6 (a2), (a3), (a4), (b2), and (b3) are diagrams to show plane orientations that can exist in the Fin structure.

The present invention was accomplished in view of the above-described problems. It is an object of the present invention to provide a method for manufacturing a semiconductor device that is capable of preventing a defect from being introduced into a Fin structure when the Fin structure is subjected to ion implantation and recovery heat treatment. The present invention also aims to provide a method for evaluating a semiconductor device that is capable of accurately evaluating the recovering process of a defect in a Fin structure caused by ion implantation.

Solution to Problem

To accomplish the object, the present invention provides a method for manufacturing a semiconductor device, comprising:

forming a Fin structure on a semiconductor silicon substrate, performing ion implantation into the Fin structure, and subsequently performing recovery heat treatment on the semiconductor silicon substrate to recrystallize silicon of the Fin structure, wherein the Fin structure is processed so as not to have an end face of a {111} plane of the semiconductor silicon onto a sidewall of the Fin structure to be formed.

When a Fin structure is processed so as not to have an end face of the {111} plane of the semiconductor silicon onto the sidewall of the Fin structure to be formed as described above, the Fin structures are allowed to decrease defects caused by residual damage formed in the Fin structure after ion implantation In this case, it is preferred that the Fin structure is formed such that the sidewall of the Fin structure to be formed and a bottom of the Fin structure to be formed make an angle that is smaller than an angle between the {111} plane of the semiconductor silicon and the bottom of the Fin structure to be formed.

The angle between the {111} plane of the semiconductor silicon and the bottom of the Fin structure to be formed can be easily found theoretically from the plane orientation of a semiconductor silicon substrate to be used. When the angle between the sidewall and the bottom of a Fin structure is set to a smaller angle than the angle described above, it becomes more certain that the Fin structure is allowed to decrease defects formed therein due to residual damage after ion implantation.

It is also preferred that the main surface of the semiconductor silicon substrate has a plane orientation of (100), and the sidewall of the Fin structure to be formed and a bottom of the Fin structure to be formed make an angle of less than 54.7°.

When the sidewall of a Fin structure is formed to have such an angle in a semiconductor silicon substrate with the main surface having a plane orientation of (100), which is conventionally used, it becomes more certain that the Fin structure is allowed to decrease defects therein due to residual damage after ion implantation.

To accomplish the above object, the present invention also provides a method for evaluating a semiconductor device, comprising:

evaluating a defect of the Fin structure of a semiconductor device caused by the ion implantation, the a semiconductor device being manufactured by the method for manufacturing a semiconductor device, wherein the recovery heat treatment is performed in a temperature range of 550° C. or more and 650° C. or less by changing time, and a cross section of the Fin structure is observed through TEM after the recovery heat treatment to evaluate the defect caused by the ion implantation in the course of the recrystallization.

The method for evaluating a semiconductor device like this is free from forming a defect caused by unevenness of recovery rate in the course of recovering the crystallinity in a Fin structure, thereby making it possible to accurately evaluate the recovering process of an ion implantation defect.

Advantageous Effects of Invention

The inventive method for manufacturing a semiconductor device makes it possible to prevent occurrence of a defect caused by residual damage after ion implantation in a Fin structure, which is adopted in advanced devices, thereby making it possible to construct process of a minute semiconductor. The inventive method for evaluating a semiconductor device makes it possible to accurately evaluate a process of recovering an ion implantation defect.

DESCRIPTION OF EMBODIMENTS

Hereinafter, the present invention will be described specifically by reference to FIGS, but the present invention is not limited thereto.

The present inventors presumed that ion implantation defects remained in the edge of a Fin structure (ion implantation defects including a twin remained in the edge of a Fin structure when the Fin structure is formed on a semiconductor silicon substrate and subjected to ion implantation, followed by recovery heat treatment of the semiconductor silicon substrate to recrystallize the silicon in the Fin structure) are formed in the course of recovery heat treatment, and are caused by the difference in recovery rates of crystallinity in the Fin structure. Fin structures are commonly formed so as to extend to the parallel direction or vertical direction on the basis of the (110) orientation, which a notch is formed to.

Regarding this dependence on plane orientations, which relates to interface state density when a MOS structure is formed on the main surface, (111) plane has a problem of lowering the channel mobility due to many interface state, and therefore, (100) wafers have been adopted (e.g., NON-PATENT LITERATURE 2). In this case, the recrystallization of Fin structure grows along the direction of <111> axis in the recovery heat treatment.

This recovery of crystallinity along the direction of <111> axis becomes a facet growing system in which recovery of the crystallinity of a whole (111) plane is followed by recovery of the crystallinity of the next (111) plane. In this case, when a Fin structure is under thermal conditions with uneven temperature distribution, recovery of crystallinity of a whole (111) plane does not complete before starting recovery of crystallinity of the next (111) plane, thereby causing crystalline growth (recovery of crystallinity) in a state of insufficient recovery of the crystallinity. The inventors presumed that this is the reason why the Fin structure tends to have a remained ion implantation defect (defect caused by residual damage after ion implantation). The inventors have found that remaining of an ion implantation defect is successfully prevented by forming a Fin structure so as not to cause crystal growth along the direction of <111> axis, thereby bringing the present invention to completion. It is possible to prevent (111) plane from appearing in a Fin structure to prevent remaining of an ion implantation defect, particularly when a (100) wafer is used, by setting the sidewall angle of the Fin structure (the angle between the sidewall of the Fin structure to be formed and the bottom of the Fin structure to be formed) to less than 54.7°.

Figure 1:
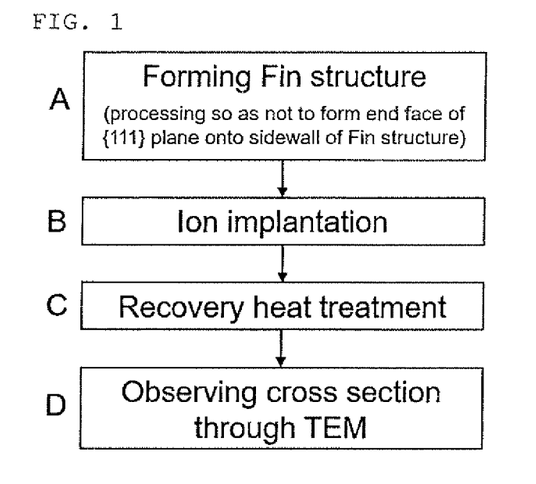
FIG. 1 is a schematic diagram showing a flowchart of the inventive manufacturing method and evaluation method for a semiconductor device.

Subsequently, the inventive manufacturing method and evaluation method for a semiconductor device will be described specifically by reference to FIG. 1. The inventive method for manufacturing a semiconductor device is a method for manufacturing a semiconductor device that includes forming a Fin structure having an upwardly convex shape on a semiconductor silicon substrate (A of FIG. 1), performing ion implantation into the Fin structure (B of FIG. 1), and subsequently performing recovery heat treatment on the semiconductor silicon substrate (C of FIG. 1) to recrystallize silicon of the Fin structure. In the present invention, the Fin structure is processed in the step of A of FIG. 1 so as not to have an end face of a {111} plane of the semiconductor silicon onto a sidewall of the Fin structure to be formed. When a Fin structure is processed in this way, the Fin structure is allowed to decrease defects formed therein due to residual damage after ion implantation. That is, it is possible to prevent a defect formed due to difference of recrystallization rate by preventing an end face of the {111} plane, which has particularly large surface density, from appearing onto the sidewall when performing ion implantation to change the implanted area to be amorphous and subsequent recovery heat treatment to change the amorphous silicon to be a single crystal.

In the step A, it is preferred to form the Fin structure such that the sidewall of the Fin structure to be formed and the bottom of the Fin structure to be formed make an angle that is smaller than the angle between the {111} plane of the semiconductor silicon and the bottom of the Fin structure to be formed. The angle between the {111} plane of the semiconductor silicon and the bottom of the Fin structure to be formed can be easily found theoretically from the plane orientation of a semiconductor silicon substrate to be used. When the angle between the sidewall and the bottom of a Fin structure is set to a smaller angle than the angle described above, the Fin structure is allowed to securely decrease defects formed therein due to residual damage after ion implantation. In addition, such a Fin structure can be formed easily.

It is also preferred that the main surface of the semiconductor silicon substrate has a plane orientation of (100), and the sidewall of the Fin structure to be formed and the bottom of the Fin structure to be formed make an angle of less than 54.70. When the sidewall of a Fin structure is formed to have such an angle in a semiconductor silicon substrate with the main surface having a plane orientation of (100), which is conventionally used, it becomes more certain that the Fin structure is allowed to decrease defects therein due to residual damage after ion implantation.

Specifically, by the following procedure, the above described Fin structure formation, the ion implantation, and the recovery heat treatment can be performed. First, a semiconductor silicon substrate is prepared to have the main surface of (100) and a notch formed in the (110) orientation, subjected to photolithography, and then subjected to dry etching to form a Fin structure on the silicon substrate. In this case, the Fin structure is processed such that the sidewall angle is less than 54.7° so as not to have an end face of the (111) plane onto the sidewall thereof. Subsequently, this Fin structure is subjected to ion implantation, in which dopant has to be also implanted into the sidewall of the Fin structure not only from the front (right overhead) as in previous method. Accordingly, ions are introduced into the right and left sidewalls of the Fin structure from an angle tilted by 45° from the vertical direction to implant dopant into the overall Fin structure. Then, anneal (recovery heat treatment), which combines recovery of a defect and activation, is performed. The anneal performed on ordinary devices includes anneal in a short period of several milli-seconds such as FLA (flash lamp anneal) or anneal in several seconds such as RTA (rapid thermal anneal of rapid heating and rapid cooling). Even after these heat treatment, a Fin structure, particularly the tip of the Fin structure, contains a remained defect caused by ion implantation when the sidewall angle is 54.7° or more. When the sidewall angle of a Fin structure is less than 54.7°, it is possible to prevent remaining of a defect at the tip of the Fin structure.

After ion implantation, the silicon in a Fin structure becomes amorphous, and the recrystallization thereof occurs in annealing after the ion implantation. The Fin structure has a single crystal portion, which becomes a seed of recrystallization, only at the lower part of the Fin structure. In recovery heat treatment, the recrystallization of the Fin structure is started from the single crystal portion at the lower part. In this case, it is considered that the recrystallization rates differ in the interior of the Fin structure (NON-PATENT LITERATURE 3). Accordingly, the growth along the direction of <111> axis is liable to cause a remained ion implantation defect.

On the other hand, without the growth along the direction of <111> axis, recrystallization proceeds firmly even when the recrystallization rates differ in the interior of the Fin structure. Accordingly, it is possible to prevent remaining of an ion implantation defect.

The inventive method for evaluating a semiconductor device is a method for evaluating a defect caused by ion implantation in the Fin structure of a semiconductor device manufactured by the method for manufacturing a semiconductor device described above. This is an evaluation method in which the recovery heat treatment is performed in a temperature range of 550° C. or more and 650° C. or less by changing time, and a cross section of the Fin structure is observed through TEM (Transmission Electron Microscope) after the recovery heat treatment (D of FIG. 1) to evaluate the defect caused by the ion implantation in the course of the recrystallization. The method for evaluating a semiconductor device like this prevents occurrence of a defect caused by unevenness of recovery rate in the course of recovering the crystallinity in a Fin structure, thereby making it possible to accurately evaluate the recovering process of an ion implantation defect.

To evaluate defects such as a twin introduced into a Fin structure in the course of recrystallization, the inventive method for manufacturing a semiconductor device includes ion implantation into a Fin structure of silicon, not conventional burring and diffusion to a silicon substrate, recovery heat treatment of the silicon that is changed to amorphous by the ion implantation, and recrystallization, wherein the inventive method for manufacturing a semiconductor device is applied. Then, the manufactured semiconductor device is annealed in a temperature range of 550° C. or more and 650° C. or less by changing time, followed by TEM observation. This makes it possible to evaluate and investigate the behavior of the defect at the edge of the Fin easily without using minute leading-edge process.

When the temperature of the recovery heat treatment is less than 550° C., recrystallization is inhibited, and the evaluation becomes difficult thereby. When the temperature of the recovery heat treatment is more than 650° C., the crystallization rate becomes too high, thereby making it difficult to observe the recovery process specifically. When the rate of single crystallization of amorphous silicon is reduced, that is, the annealing is performed at a moderately lower temperature to investigate the behavior of a defect, it becomes possible to research and investigate the behavior of a defect more specifically.

EXAMPLES

Hereinafter, the present invention will be specifically described by showing Example and Comparative Example, but the present invention is not limited thereto.

Example

A silicon substrate with a diameter of 200 mm doped with boron was prepared in which the main surface had a plane orientation of (100) and the resistivity was 10 Ω·cm. First, this silicon substrate was coated with a resist and subjected to photolithography. In this case, the notch position was in the (110) orientation, and the L&S (a pattern having lines of Fin structure and spaces alternated with each other) was formed in the (110) orientation as it was. In the photolithography, negative type resist was selected, and a pattern with L&S of 1.2 μm was formed in the surface of the silicon substrate. This wafer with the resist was etched by dry etching, and subjected to removal of the resist with a mixed solution of sulfuric acid and hydrogen peroxide, followed by RCA cleaning. In this case, the dry etching conditions were set to include $CF_4$ base, pressure of 3000 mTorr (400 Pa), and output power of 300 W.

Figure 2:
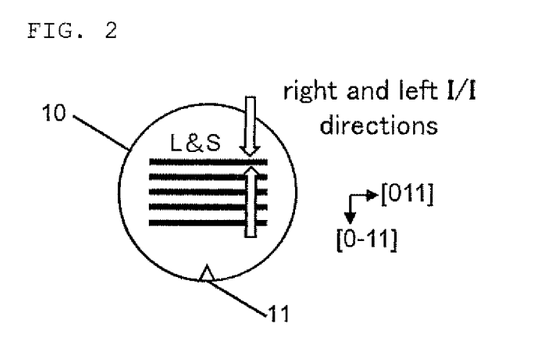
FIG. 2 is a schematic diagram showing a relationship between L&S and the direction of ion implantation.

Into this wafer, As was implanted from three directions of right above as well as right and left with the acceleration voltage (acceleration energy) of 450 keV and the dose amount of $1\times10^{15}$ atoms/cm². FIG. 2 shows a relationship between L&S formed on the silicon substrate 10 and the direction of ion implantation. Incidentally, the indication of the ion implantation from right above direction is omitted from FIG. 2.

Figure 3:
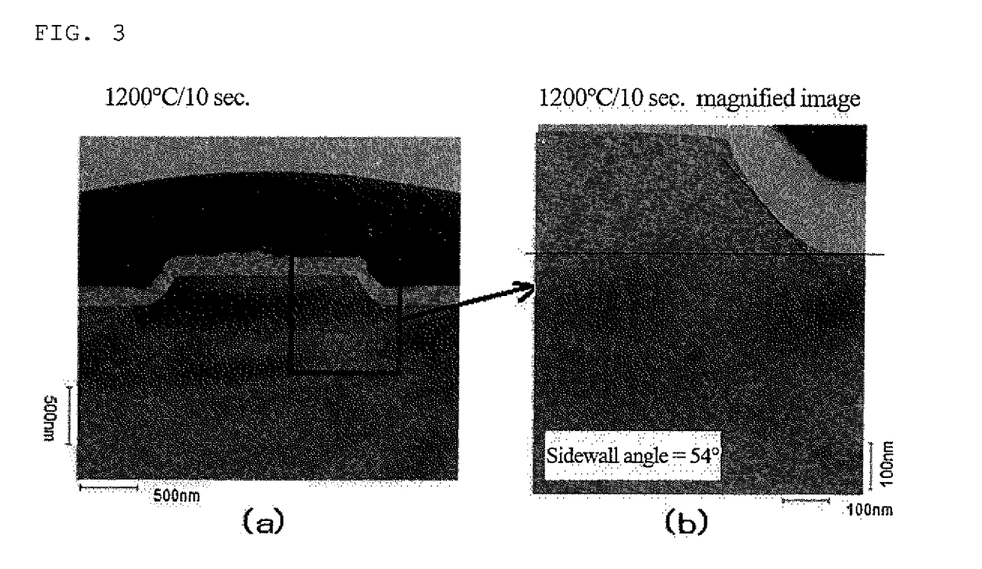
FIG. 3 shows photographs of TEM images (FIG. 3(b) is a magnified image of part of FIG. 3(a)) of a cross section of a Fin structure after recovery heat treatment when the sidewall angle was set to 540 (Example)

In the thus produced pseudo-Fin structure, the sidewall angle of the Fin structure was 540, which was slightly smaller than the angle to expose the (111) plane. This silicon substrate was annealed under conditions of 1200° C., 10 seconds, and an atmosphere for annealing of $N_2$ using an RTA apparatus, and the state of recovery of the defect was observed in the cross section through TEM. The results are shown in FIGS. 3(a) and (b) (FIG. 3(b) is a magnified image of part of FIG. 3(a)). From FIGS. 3(a) and (b), it was found that the Fin structure did not contain a defect when the inventive method for manufacturing a semiconductor device was applied. In the present Example, the evaluation of a defect was performed on a pseudo-Fin structure, not an actual FinFET. However, it is considered that the results obtained in this pseudo-Fin structure will be also obtained in an actual FinFET.

Comparative Example

Figure 4:
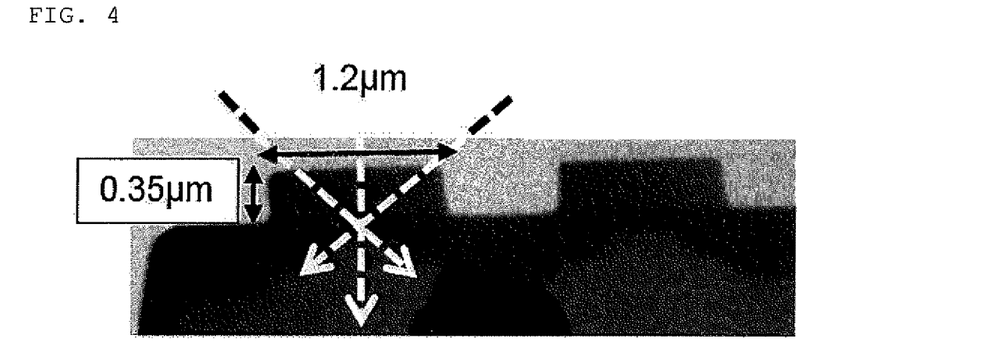
FIG. 4 is a photograph of a TEM image of a cross section of a Fin structure immediately after ion implantation.

A silicon substrate with a diameter of 200 mm doped with boron was prepared in which the main surface had a plane orientation of (100) and the resistivity was 10 Ω·cm. First, this silicon substrate was coated with a resist and subjected to photolithography. In this case, the notch position was in the (110) orientation, and the L&S was formed in the (110) orientation as it was. In the photolithography, negative type resist was selected, and a pattern with L&S of 1.2 μm was formed in the surface of the silicon substrate. This wafer with the resist was etched by dry etching, and subjected to removal of the resist with a mixed solution of sulfuric acid and hydrogen peroxide, followed by RCA cleaning. In this case, the dry etching conditions were set to include HBr and $Cl_2$ in 1:1, pressure of 1200 mTorr (160 Pa), and output power of 300 W. Into this wafer, As was implanted from three directions of right above as well as right and left with the acceleration voltage (acceleration energy) of 450 keV and the dose amount of $1\times10^{15}$ atoms/cm². The cross section of this structure is shown in FIG. 4. In FIG. 4, the dark black part with contrast is a portion in which the silicon was changed to amorphous due to As implantation.

Figure 5:
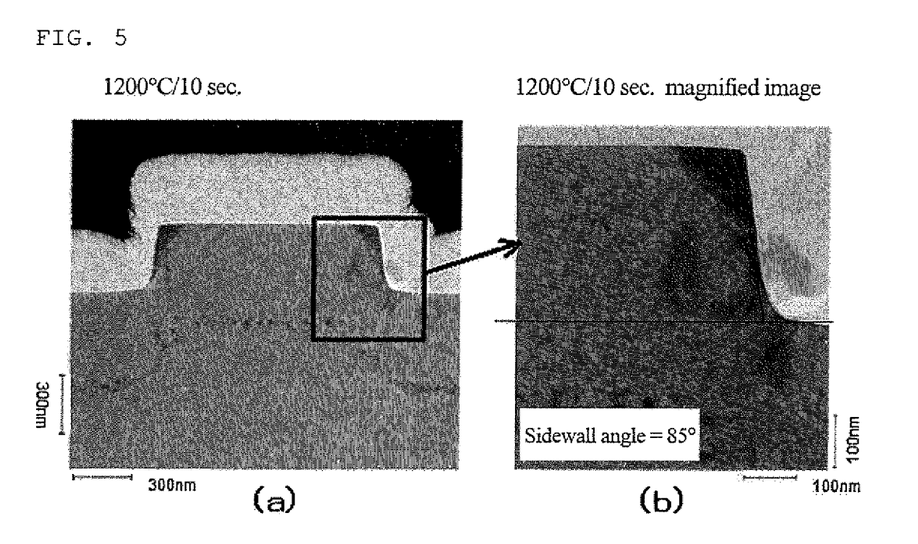
FIG. 5 shows photographs of TEM images (FIG. 5(b) is a magnified image of part of FIG. 5(a)) of a cross section of a Fin structure after recovery heat treatment when the sidewall angle was set to 85° (Comparative Example)

In the thus produced pseudo-Fin structure, the sidewall angle of the Fin structure was 850. This silicon substrate was annealed under conditions of 1200° C., 10 seconds, and an atmosphere for annealing of $N_2$ using an RTA apparatus, and the state of recovery of the defect was observed in the cross section through TEM. The results are shown in FIGS. 5(a) and (b) (FIG. 5(b) is a magnified image of part of FIG. 5(a)). In Comparative Example, the Fin structure was observed that defects were remained at the edge thereof.

As described above, in Example, where the inventive method for manufacturing a semiconductor device was applied, a defect was not observed in the interior of the Fin structure after the recovery heat treatment. On the other hand, remaining of defects were observed clearly in Comparative Example. From these results, it was confirmed that the inventive method for manufacturing a semiconductor device makes it possible to prevent occurrence of a defect due to residual damage after ion implantation in a Fin structure.

It should be noted that the present invention is not limited to the foregoing embodiments. The embodiments are just exemplification, and any examples that have substantially the same feature and demonstrate the same functions and effects as those in the technical concept described in claims of the present invention are included in the technical scope of the present invention.

The invention claimed is:

1. A method for manufacturing a semiconductor device, comprising:
    forming a Fin structure on a semiconductor silicon substrate,
    performing ion implantation into the Fin structure, and subsequently
    performing recovery heat treatment on the semiconductor silicon substrate to recrystallize silicon of the Fin structure,
    wherein the Fin structure is processed
        such that the main surface of the semiconductor silicon substrate has a plane orientation of (100), and the sidewall of the Fin structure to be formed and a bottom of the Fin structure to be formed make an angle of less than 54.7° so as not to have an end face of a {111} plane of the semiconductor silicon onto the sidewall of the Fin structure to be formed.

2. The method for manufacturing a semiconductor device according to claim 1, wherein the Fin structure is formed such that the sidewall of the Fin structure to be formed and a bottom of the Fin structure to be formed make an angle that is smaller than an angle between the {111} plane of the semiconductor silicon and the bottom of the Fin structure to be formed.

3. A method for evaluating a semiconductor device, comprising:
    evaluating a defect of the Fin structure of a semiconductor device caused by the ion implantation, the a semiconductor device being manufactured by the method for manufacturing a semiconductor device according to claim 1,
    wherein the recovery heat treatment is performed in a temperature range of 550° C. or more and 650° C. or less by changing time, and a cross section of the Fin structure is observed through TEM after the recovery heat treatment to evaluate the defect caused by the ion implantation in the course of the recrystallization.

4. A method for evaluating a semiconductor device, comprising:
evaluating a defect of the Fin structure of a semiconductor device caused by the ion implantation, the a semiconductor device being manufactured by the method for manufacturing a semiconductor device according to claim 2,
wherein the recovery heat treatment is performed in a temperature range of 550° C. or more and 650° C. or less by changing time, and
a cross section of the Fin structure is observed through TEM after the recovery heat treatment to evaluate the defect caused by the ion implantation in the course of the recrystallization.

* * * * *